United States Patent
Guler et al.

(10) Patent No.: US 11,749,733 B2
(45) Date of Patent: *Sep. 5, 2023

(54) FIN SHAPING USING TEMPLATES AND INTEGRATED CIRCUIT STRUCTURES RESULTING THEREFROM

(71) Applicant: Intel Corporation, Santa Clara, CA (US)

(72) Inventors: Leonard P. Guler, Hillsboro, OR (US); Biswajeet Guha, Hillsboro, OR (US); Mark Armstrong, Portland, OR (US); William Hsu, Hillsboro, OR (US); Tahir Ghani, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/691,926

(22) Filed: Mar. 10, 2022

(65) Prior Publication Data

US 2022/0199792 A1    Jun. 23, 2022

Related U.S. Application Data

(63) Continuation of application No. 16/772,631, filed as application No. PCT/US2018/019456 on Feb. 23, 2018, now Pat. No. 11,302,790.

(51) Int. Cl.
*H01L 29/417* (2006.01)
*H01L 27/088* (2006.01)
(Continued)

(52) U.S. Cl.
CPC .... *H01L 29/41791* (2013.01); *H01L 27/0886* (2013.01); *H01L 29/16* (2013.01); *H01L 29/20* (2013.01); *H01L 29/785* (2013.01)

(58) Field of Classification Search
CPC .............. H01L 29/16; H01L 29/20; H01L 29/41791; H01L 29/785; H01L 27/0886
(Continued)

(56) References Cited

U.S. PATENT DOCUMENTS 9,647,067 B1    5/2017  Xiao
11,302,790 B2 *  4/2022  Guler .............. H01L 21/823431
(Continued)

FOREIGN PATENT DOCUMENTS

| CN | 106952947 | 7/2017 |
| CN | 107658268 | 2/2018 |
| WO | WO-2016209278 | 12/2016 |

OTHER PUBLICATIONS

Extended European Search Report for European Patent Application No. 18907084.0 dated Aug. 25, 2021, 7 Pgs.
(Continued)

*Primary Examiner* — Monica D Harrison
(74) *Attorney, Agent, or Firm* — Schwabe, Williamson & Wyatt, P.C.

(57) ABSTRACT

Fin shaping using templates, and integrated circuit structures resulting therefrom, are described. For example, integrated circuit structure includes a semiconductor fin having a protruding fin portion above an isolation structure above a substrate. The protruding fin portion has a vertical portion and one or more lateral recess pairs in the vertical portion. A gate stack is over and conformal with the protruding fin portion of the semiconductor fin. A first source or drain region is at a first side of the gate stack. A second source or drain region is at a second side of the gate stack opposite the first side of the gate stack.

22 Claims, 12 Drawing Sheets

(51) Int. Cl.
*H01L 29/16* (2006.01)
*H01L 29/20* (2006.01)
*H01L 29/78* (2006.01)

(58) Field of Classification Search
USPC .......................................................... 257/365
See application file for complete search history.

(56) References Cited

U.S. PATENT DOCUMENTS

| | | |
|---|---|---|
| 2007/0231997 A1 | 10/2007 | Doyle et al. |
| 2008/0017934 A1 | 1/2008 | Kim et al. |
| 2014/0145248 A1 | 5/2014 | Cheng |
| 2015/0364594 A1 | 12/2015 | Mieno |
| 2016/0056293 A1 | 2/2016 | Yeh et al. |
| 2016/0197005 A1 | 7/2016 | Tsao et al. |
| 2017/0178960 A1 | 6/2017 | Basker |

OTHER PUBLICATIONS

International Search Report and Written Opinion for International Patent Application No. PCT/US2018/019456 dated Nov. 22, 2018, 11 pgs.
International Preliminary Report on Patentability for International Patent Application No. PCT/US2018/019456, dated Sep. 3, 2020, 8 pgs.
Office Action from Taiwan Patent Application No. 108101367, dated Feb. 22, 2022, 9 pgs.
Notice of Allowance from Taiwan Patent Application No. 108101367, dated Jun. 17, 2022, 3 pgs.

* cited by examiner

FIN SHAPING USING TEMPLATES AND INTEGRATED CIRCUIT STRUCTURES RESULTING THEREFROM

CROSS-REFERENCE TO RELATED APPLICATION

This patent application is a continuation of U.S. patent application Ser. No. 16/772,631, filed Jun. 12, 2020, which is a U.S. National Phase Application under 35 U.S.C. § 371 of International Application No. PCT/US2018/019456, filed Feb. 23, 2018, entitled "FIN SHAPING USING TEMPLATES AND INTEGRATED CIRCUIT STRUCTURES RESULTING THEREFROM," which designates the United States of America, the entire disclosure of which are hereby incorporated by reference in their entirety and for all purposes.

TECHNICAL FIELD

Embodiments of the disclosure are in the field of semiconductor devices and processing and, in particular, fin shaping using templates, and integrated circuit structures resulting therefrom.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
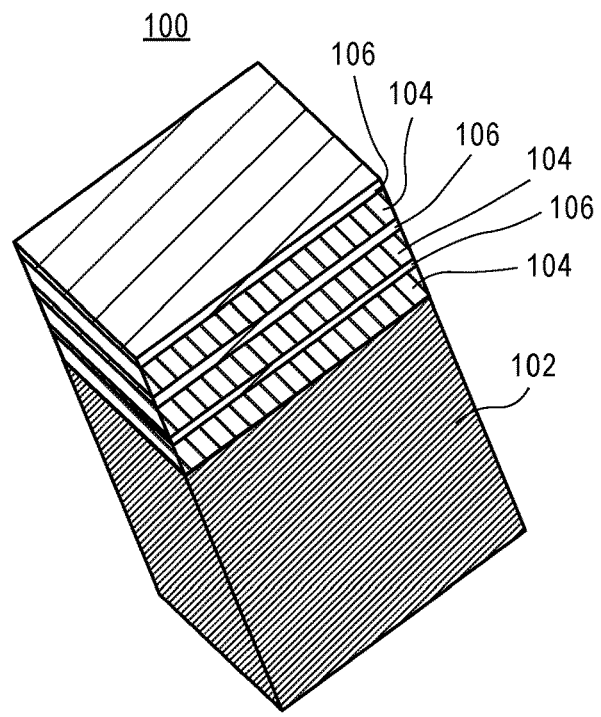
FIGS. 1A-1R illustrate angled double cross-sectional views (and, in some instances, direct single cross-sectional views) of various operations in a method of fabricating semiconductor fins using a fin shaping approach based on templates, in accordance with an embodiment of the present disclosure.

Fin shaping using templates, and integrated circuit structures resulting therefrom, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to approaches for modulation of a semiconductor fin geometry. Fin architectures described herein may be implemented to improve device performance by enabling improved short channel effects. Approaches may similarly be implemented to modify integration of nanowires with very small vertical gaps. In an embodiment, a fin template is generated using horizontal layering of films of differing isotropic etch rates. A semiconductor fin is then grown through the template to generate a desired form. It is to be appreciated that in or more embodiments described herein, a fin is formed in an opening as opposed to being subtractively etched into a semiconductor material.

Generally, new device structures are described that include new channel architectures for field effect transistors (FETs) such as finFETs, trigate FETs, or nanowire FETs. One or more embodiments include devices using such channel architectures to provide reduced external resistance (Rext) and capacitance as otherwise observed for conventional finFET devices. Furthermore, improved short channel effects (e.g., reduced leakage) are achieved as otherwise observed for conventional finFET devices. One or more embodiments may be applicable for high performance, low leakage logic complementary metal oxide semiconductor (CMOS) devices.

More specifically, one or more embodiments described herein are directed to approaches for forming silicon (Si)-containing non-planar architectures. For example, in an embodiment one or more devices described herein may be characterized as a Si-based device, a nanoribbon-based device, a nanowire-based device, a non-planar transistor, an omega-FET, a trigate-based device, a multi-gate device, or a combination thereof.

Figure 1B:
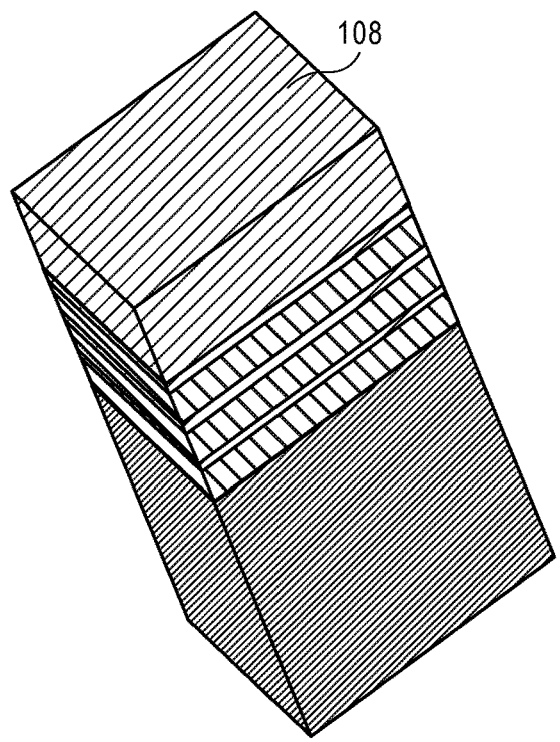
Figure 1C:
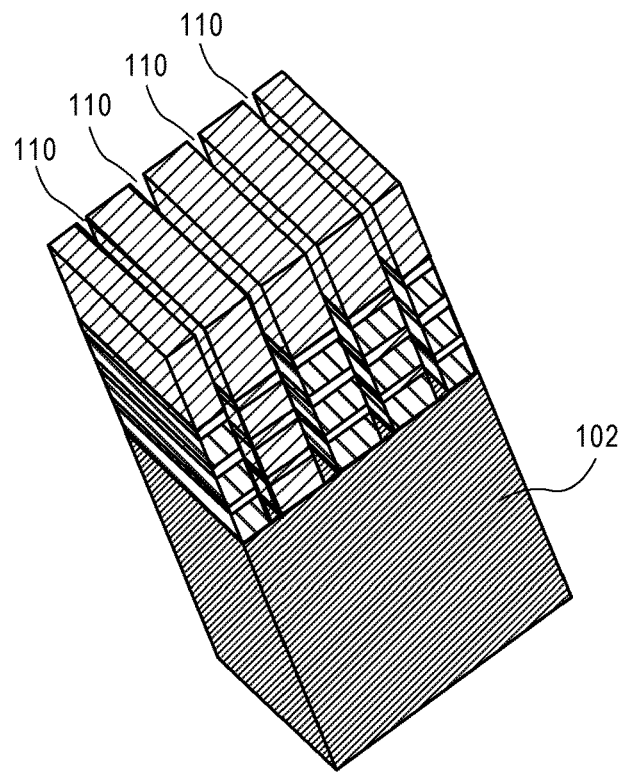
Figure 1D:
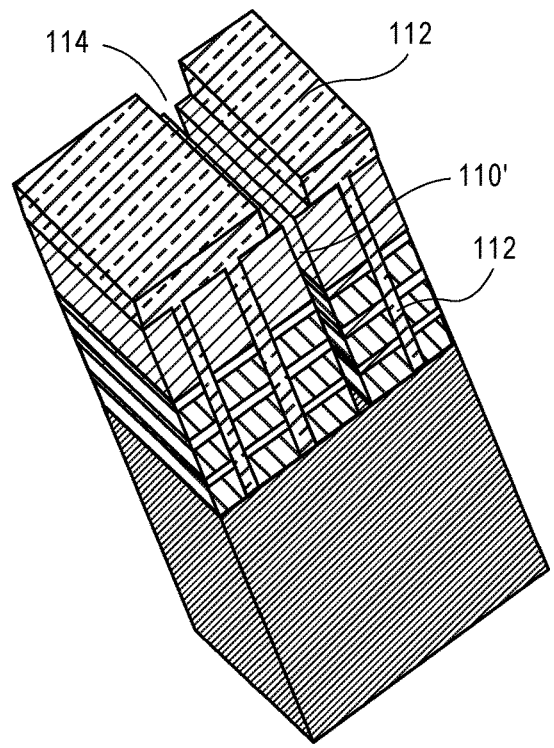
Figure 1E:
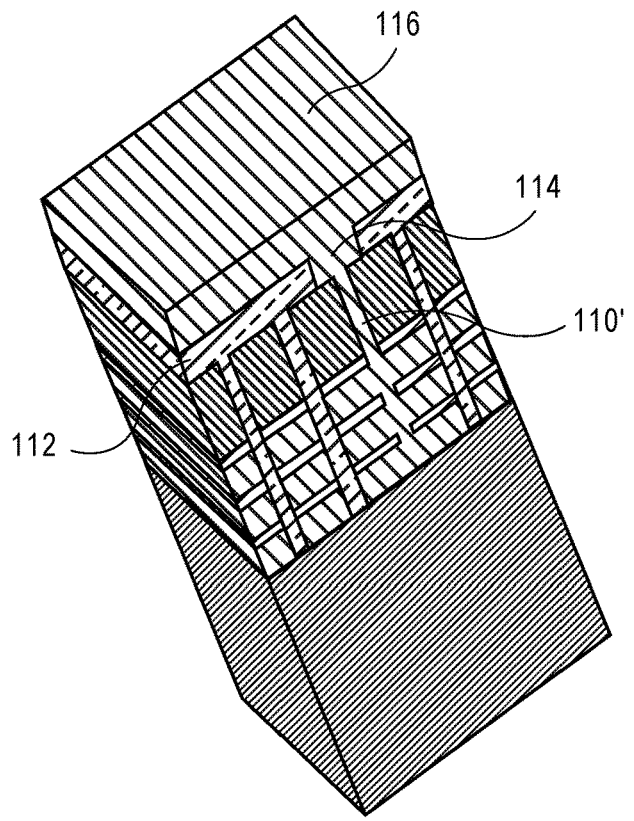
Figure 1F:
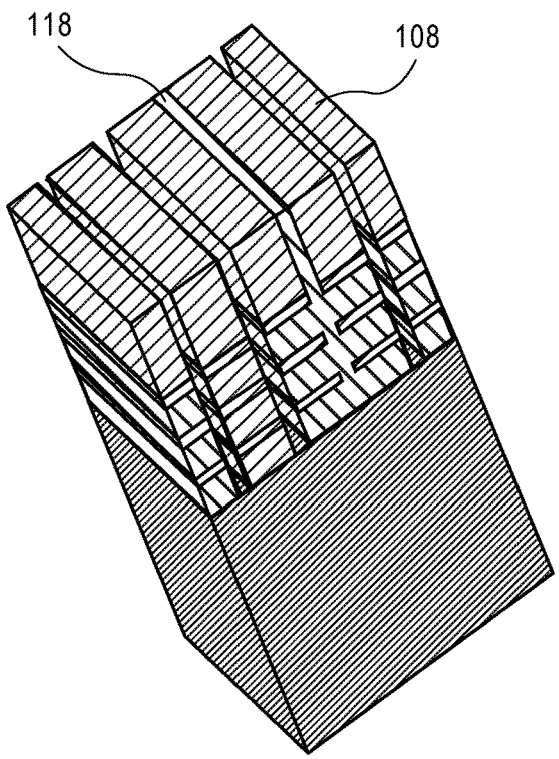
Figure 1G:
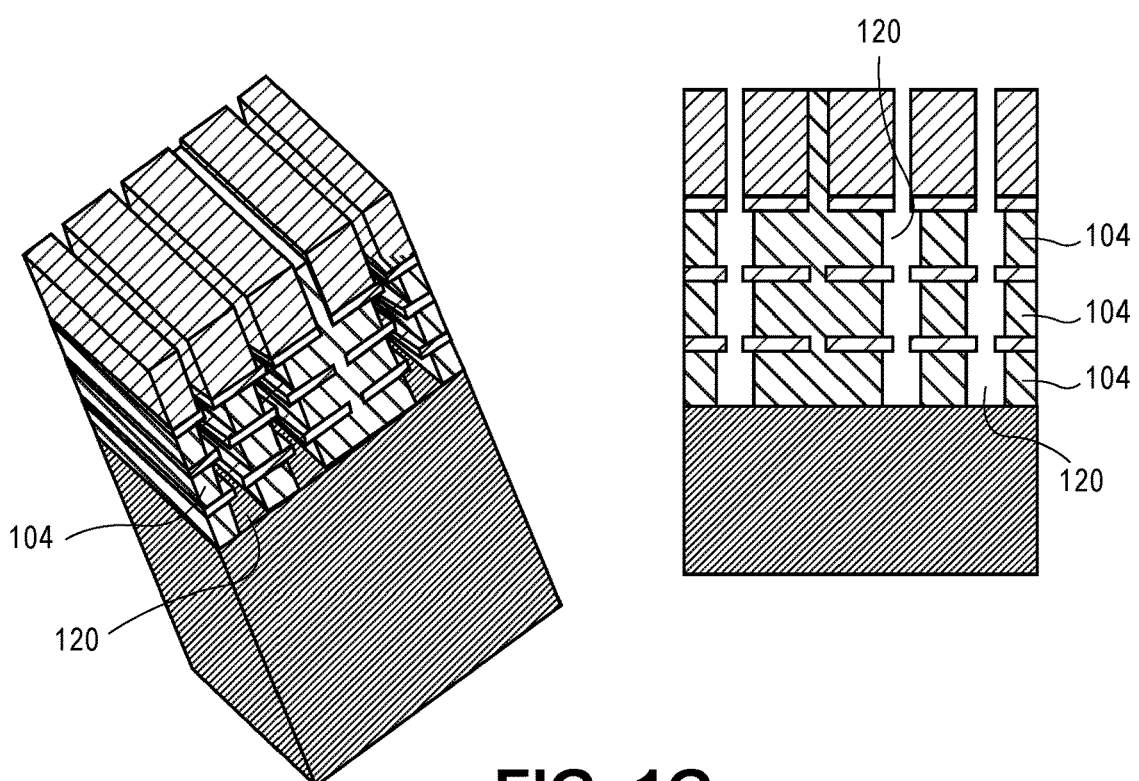
Figure 1H:
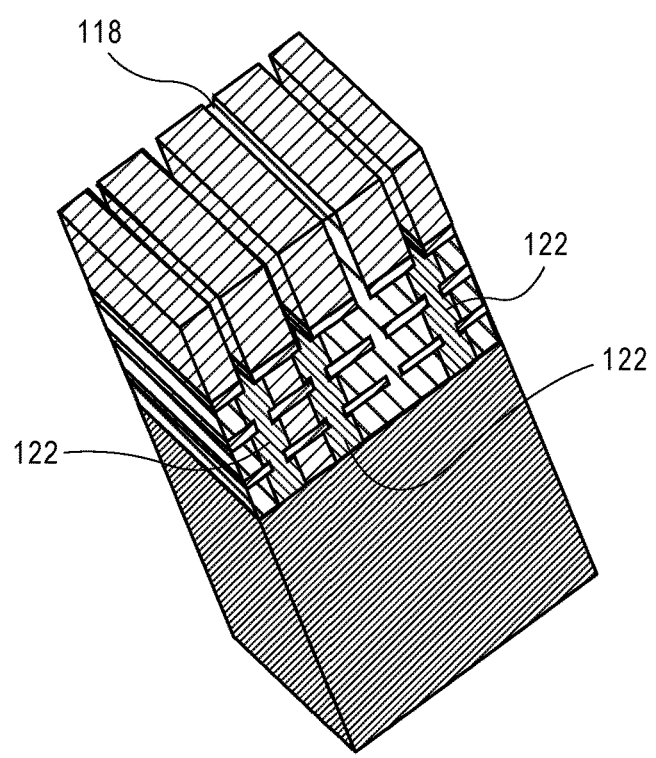
Figure 1I:
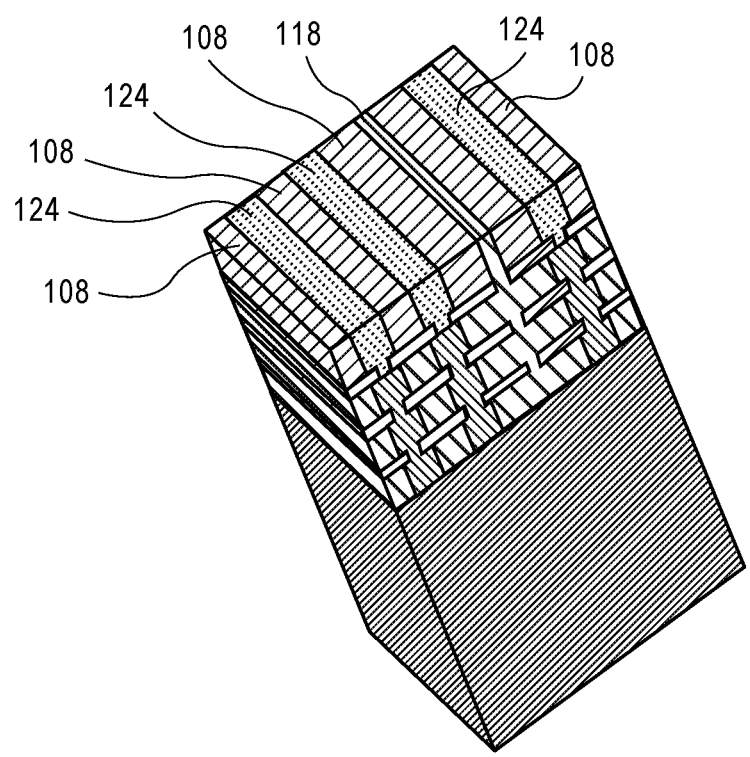
Figure 1J:
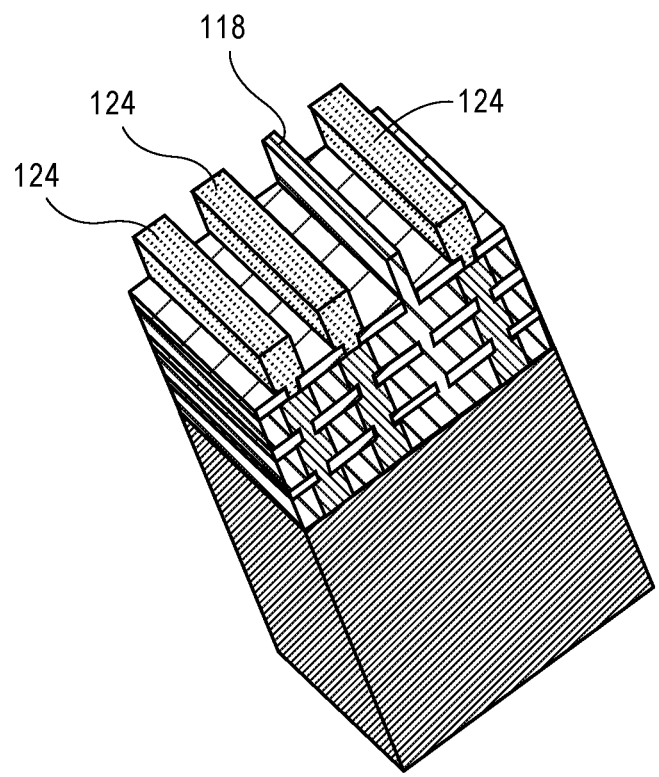
Figure 1K:
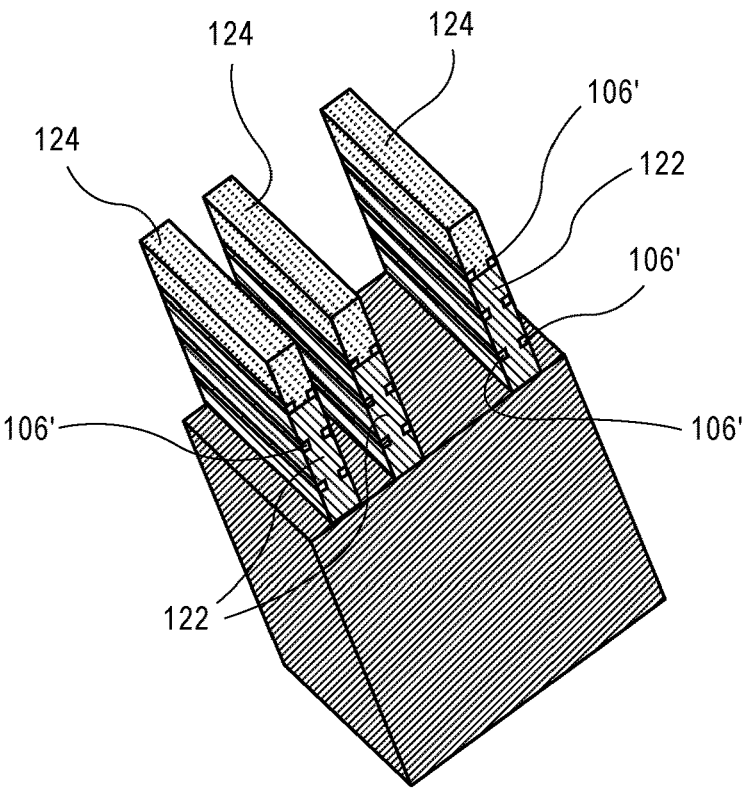
Figure 1L:
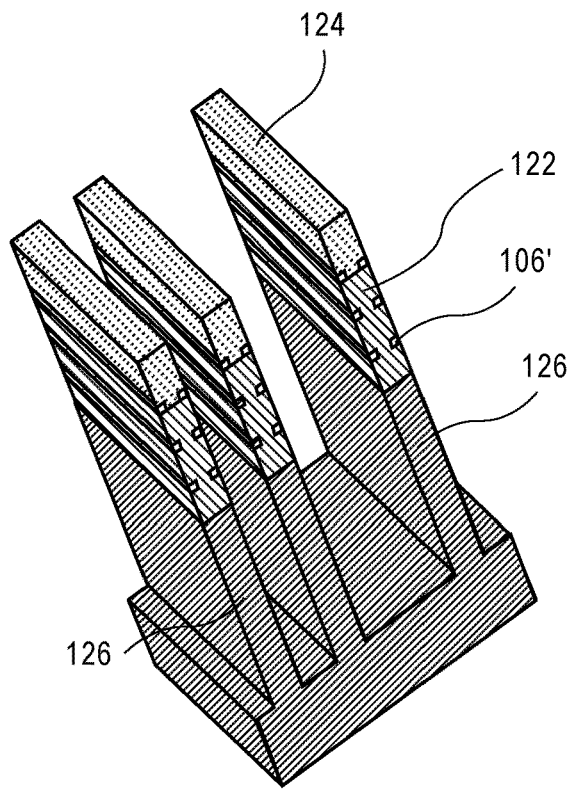
Figure 1M:
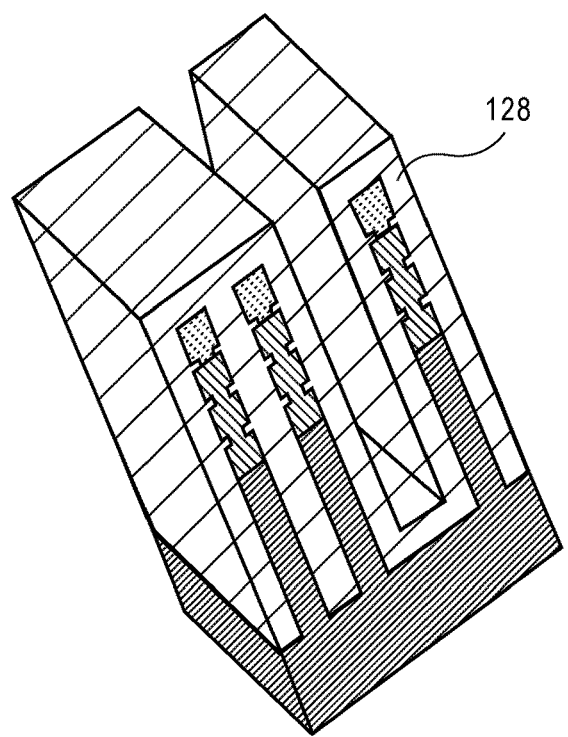
Figure 1N:
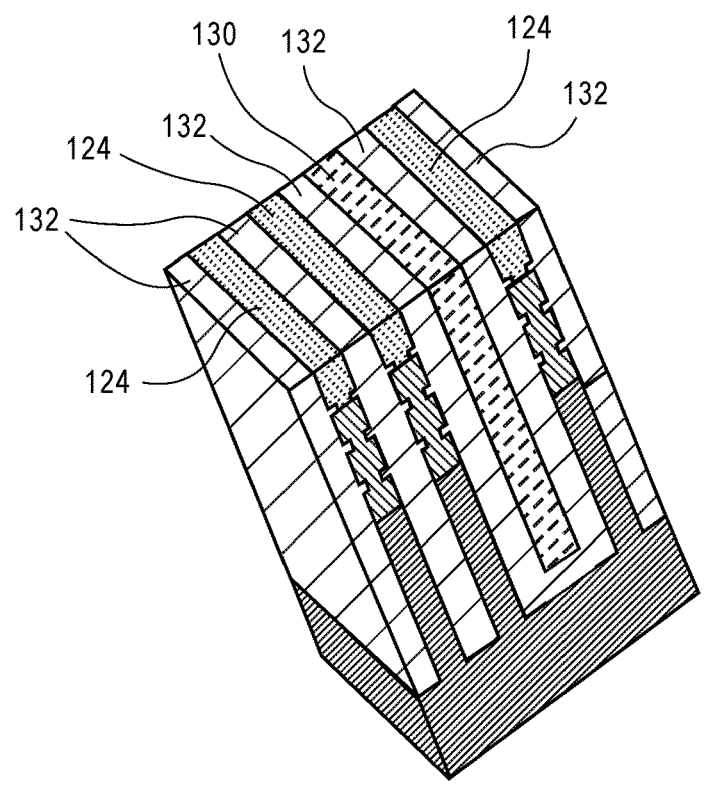
Figure 1O:
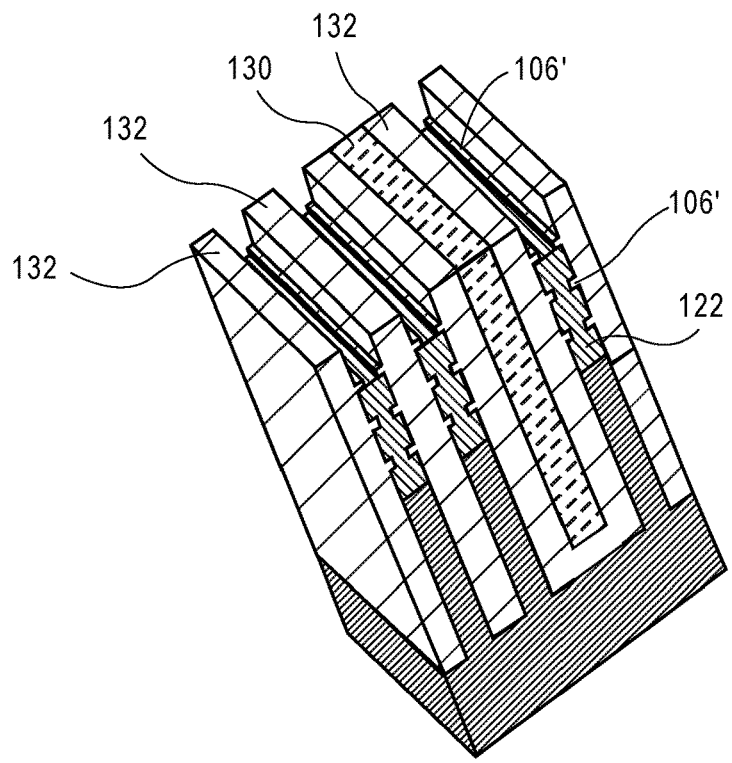
Figure 1P:
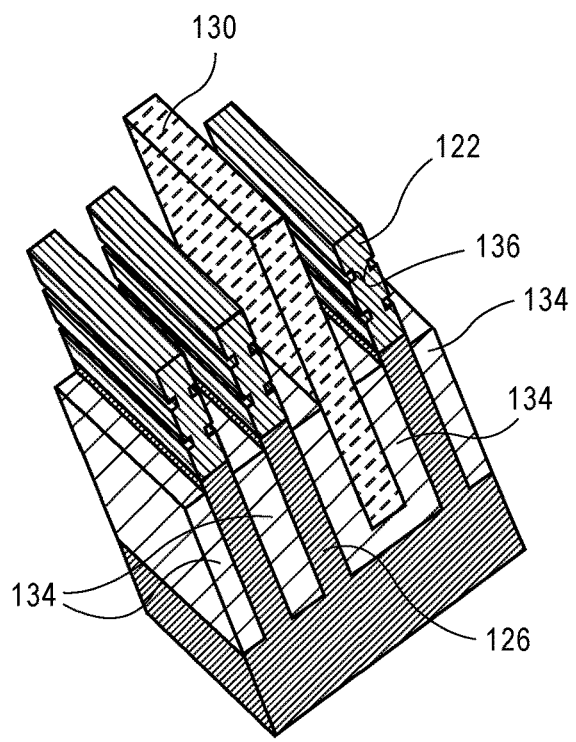
Figure 1Q:
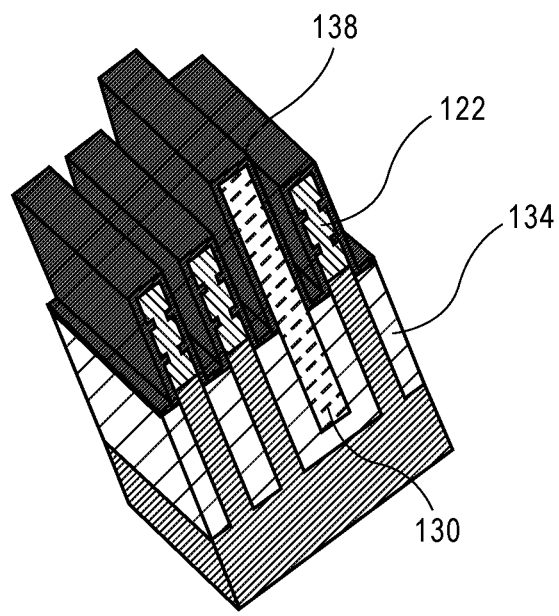
Figure 1R:
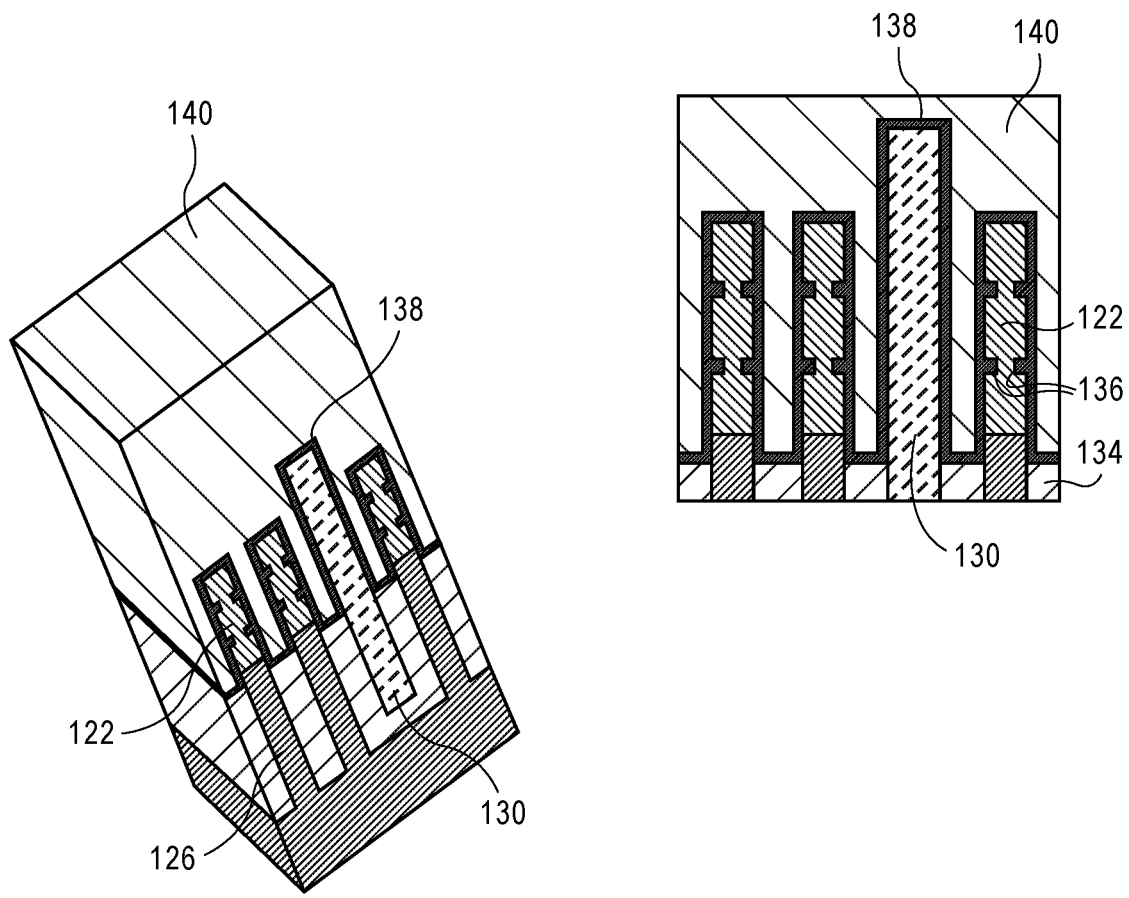

In an exemplary processing scheme representative of one or more embodiments of the present disclosure, FIGS. 1A-1R illustrate angled double cross-sectional views (and, in some instances, direct single cross-sectional views) of various operations in a method of fabricating semiconductor fins using a fin shaping approach based on templates, in accordance with an embodiment of the present disclosure.

Referring to FIG. 1A, a starting structure 100 includes a substrate 102, with a stack of alternating insulating layers 104 and 106 thereon. In an embodiment, the alternating insulating layers 104 and 106 are alternating layers of material having a different etch rates, e.g., in a wet etch process. For example, in an embodiment, insulating layers 104 have a faster etch rate in an oxide wet etchant as compared to an etch rate of insulating layers 106 in the same oxide wet etchant. In a particular, embodiment, the insulating layers 104 are composed of a relatively low density silicon oxide material, while the insulating layers 106 are composed of a relatively high density silicon oxide material. In accordance with embodiments described herein, although three pairs 104/106 are shown as a non-limiting example, a minimum of two pairs 104/106 are provided to provide an effective fin shaping template.

In the exemplary embodiment shown, the substrate 102 is a bulk semiconductor substrate, such as a bulk monocrystalline silicon substrate. In an embodiment, the bulk semiconductor substrate 102 is a bulk single crystalline silicon substrate provided having fins 102 etched therein. In one embodiment, the bulk semiconductor substrate 102 is undoped or lightly doped at this stage. For example, in a particular embodiment, the bulk semiconductor substrate 102 has a concentration of less than approximately 1E17 atoms/cm3 of boron dopant impurity atoms.

Referring to FIG. 1B, a hardmask 108 is formed on the structure of FIG. 1A. In a particular embodiment, the hardmask 108 is a silicon nitride hardmask.

Referring to FIG. 1C, openings 110 are formed into the hardmask layer 108 and extend through the alternating insulating layers 104 and 106 to expose substrate 102 of the structure of FIG. 1B. In accordance with one or more embodiments described herein, the openings 110 are referred to as a fin etch inverted pattern in that the openings 110 represent locations where fins may be formed, as opposed to being locations where fin forming material is etched away.

In an embodiment, as is used throughout the present description, lithographic operations are performed using 193 nm immersion lithography (i193), EUV and/or EBDW lithography, or the like. A positive tone or a negative tone resist may be used. In one embodiment, a trilayer mask composed of a topographic masking portion, an anti-reflective coating (ARC) layer, and a photoresist layer is used as a lithographic mask to provide the pattern of openings 110. In a particular such embodiment, the topographic masking portion is a carbon hardmask (CHM) layer and the anti-reflective coating layer is a silicon ARC layer.

Pitch division processing and patterning schemes may be implemented to enable embodiments described herein or may be included as part of embodiments described herein, e.g., to form openings 110. Pitch division patterning typically refers to pitch halving, pitch quartering etc. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

Referring to FIG. 1D, in an optional embodiment where select locations of the openings 110 of the structure of FIG. 1C are blocked from fin formation, a mask 112 is formed above and in openings 110. An opening 114 is then formed in the mask 112 and extended to form a re-opened location 110' in a location where fin formation is not desired. The process may be described as a "reverse fin cut" process since fin formation is blocked as opposed to formed fins being etched away. In an embodiment, the mask 112 is or includes a carbon-based hardmask material.

Referring to FIG. 1E, a dielectric fill material 116 is formed over and in the openings of the structure of FIG. 1D, e.g., in opening 114 in mask 112 and in re-opened location 110'. In an embodiment, the dielectric fill material 116 is or includes a silicon oxide material.

Referring to FIG. 1F, the dielectric fill material 116 of the structure of FIG. 1E is planarized (e.g., polished) and recessed to form dielectric structure 118. Additionally, the remaining portions of mask 112 are removed.

Referring to FIG. 1G, an etch process is performed on the structure of FIG. 1F to form recesses 120 in insulating layers 104. In an embodiment, a wet etch process is implemented that etches insulating layers 104 faster than insulating layers 106. The applied etch may be referred to herein as a fin template etch.

Referring to FIG. 1H, a deposition process is performed to form fin structures 122. In an embodiment, the fin structures 122 are formed using an epitaxial deposition process of a semiconductor material, followed by planarization and recessing of the semiconductor material to form the structures illustrated in FIG. 1H. In an embodiment, the fin structures 122 are formed form a semiconductor material such as silicon, silicon germanium, germanium or a group III-V material. It is to be appreciated that the semiconductor material is inhibited from being formed at the location of dielectric structure 118, as is depicted.

Referring to FIG. 1I, a hardmask material is deposited on and planarized over the structure of FIG. 1H to form hardmask 124. In an embodiment, the hardmask 124 is planarized to be co-planar with hardmask 108 and dielectric structure 118, as is depicted.

Referring to FIG. 1J, the hardmask 108 is removed from the structure of FIG. 1I. Removal of hardmask 108 leaves hardmask 124 and dielectric structure 118, as is depicted.

Referring to FIG. 1K, the structure of FIG. 1J is subjected to an etch process using hardmask 126 as an etch mask. The etch process etches through insulating layers 104, through exposed portions of insulating layers 106 (leaving residual portion 106' to remain), and removes the dielectric structure 118. In an embodiment, the etch process removes oxide materials (such as silicon oxide materials) exposed not covered by hardmask 124.

Referring to FIG. 1L, the remaining pattern of FIG. 1K is used as an etch mask during a patterning of substrate 102 to form sub-fin structures 126. In an embodiment, the sub-fin structures 126 are semiconductor sub-fin structures.

As pertaining to optional processing of FIGS. 1M and 1N, and as is retained in the final structure of FIG. 1R, one or more embodiments of the present disclosure are directed to semiconductor structures or devices having one or more gate edge structures (e.g., as gate isolation regions) of gate electrodes of the semiconductor structures or devices. One or more embodiments are directed to the fabrication of local interconnects for such gate electrode structures. Additionally, methods of fabricating gate edge isolation structures in a self-aligned manner and/or methods of fabricating local interconnects are also described. In one or more embodiments, self-aligned gate edge structures are fabricated for logic transistors based on complementary metal oxide semiconductor (CMOS) devices.

To provide context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, semiconductor devices are based on semiconductor fins, and each device has a gate electrode. Additionally, each device has trench contacts (TCNs), at source and drain regions of the fins. The gate electrodes and the TCNs each have an end cap region, which is located off of the corresponding fins.

Typically, gate and TCN endcap dimensions must include an allowance for mask registration error to ensure robust transistor operation for worst case mask mis-registration, leaving an end-to-end spacing. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin edges which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

Referring to FIG. 1M, in an optional embodiment where a self-aligned gate edge (SAGE) approach is included in a fin fabrication process, a spacer material 128 is formed over and conformal with the structure of FIG. 1L.

Referring to FIG. 1N, a dielectric sage wall 130 is formed in the open region of the spacer material 128 of the structure of FIG. 1M. The structure is then planarized (e.g., polished) to form non-continuous spacers 132 from spacer material 128 and to re-expose hardmask 124.

Referring to FIG. 1O, hardmask 124 is selectively removed from the structure of FIG. 1N.

Referring to FIG. 1P, non-continuous spacers 132 are recessed to provide an insulating structure 134. Residual portions 106' of the insulating layer 106 are also removed, leaving fin structures 122 as standing structures with recess pairs 122 therein.

In an embodiment, the non-continuous spacers 132 are recessed to provide the insulating structure 134 having an upper surface below an upper surface of sub-fin structures 126, as is depicted. In such as case, the active region of the corresponding semiconductor fin is effectively extended to include the portion of the sub-fin structures 126 above the insulating structure 134. In a particular embodiment, a differing substrate semiconductor material is this included as part of the fin. In another embodiment, however, the non-continuous spacers 132 are recessed to provide the insulating structure 134 having an upper surface above an upper surface of sub-fin structures 126. In yet another embodiment, however, the non-continuous spacers 132 are recessed to provide the insulating structure 134 having an upper surface co-planar with an upper surface of sub-fin structures 126.

Referring to FIG. 1Q, a gate dielectric layer 138 is formed over and conformal with the structure of FIG. 1P. In an embodiment, the gate dielectric layer is or includes a high-k dielectric material.

Referring to FIG. 1R, a gate electrode 140 is formed over the structure of FIG. 1Q. In an embodiment, at this stage of the processing, the gate electrode is a sacrificial gate electrode structure that is ultimately replaced in a replacement gate process as a later processing operation. In another embodiment, at this stage of the processing, the gate electrode is a permanent gate electrode structure, and the gate electrode may include a metal.

With reference again to FIG. 1R, in accordance with an embodiment of the present disclosure, an integrated circuit structure includes a semiconductor fin 122 having a protruding fin portion above an isolation structure 134 above a substrate 102. The protruding fin portion has a vertical portion and one or more lateral recess pairs 136 in the vertical portion. A gate stack 138/140 is over and conformal with the protruding fin portion of the semiconductor fin 122. As described in greater detail below in association with FIG. 2B, a first source or drain region is at a first side of the gate stack. A second source or drain region is at a second side of the gate stack opposite the first side of the gate stack.

In an embodiment, the semiconductor fin 122 further includes a sub-fin portion 126 on the substrate 102 and laterally between an opening in the isolation structure 134. In one such embodiment, the sub-fin portion 126 is continuous with the protruding portion of the semiconductor fin 122, as is depicted.

In an embodiment, the substrate 102 is a monocrystalline silicon substrate, and the semiconductor fin 122 is a silicon fin. In another embodiment, the substrate 102 is a monocrystalline silicon substrate, and the semiconductor fin 122 is a silicon germanium fin or a germanium fin. In yet another embodiment, the substrate 102 is a monocrystalline silicon substrate, and the semiconductor fin 122 is a III-V material fin.

Referring again to FIG. 1R, in accordance with an embodiment of the present disclosure, an integrated circuit structure includes a plurality of semiconductor fins 122. Individual ones of the plurality of semiconductor fins 122 having a protruding fin portion above an isolation structure 134 above a substrate 102, the protruding fin portion having a vertical portion and one or more lateral recess pairs 136 in the vertical portion. A dielectric wall 130 substitutes one of the plurality of semiconductor fins 122. In one such embodiment, the dielectric wall 130 has a top surface above a top surface of the plurality of semiconductor fins 122, as is depicted. In a particular embodiment, upper surfaces of gate electrodes ultimately formed as permanent structures over the fins 122 have an uppermost surface below the top surface of the dielectric wall 130 such that the dielectric wall 130 acts to provide a self-aligned gate endcap location.

In an embodiment, although fin formation may initially be inhibited in select locations as described above, the structure of any of FIGS. 1H-1P may subsequently be subjected to a "fin cut" process where one or more select fins are removed using an etch process. In one embodiment, the select fins are removed to a level that leaves a protruding portion above the substantially planar bottom surface of the fins 122. In another embodiment, the select fins are removed to a level approximately co-planar with the substantially planar bottom surface of the fins 122. In another embodiment, the select fins are removed to a level that leaves a recess below the substantially planar surface of the bottom surface of the fins 122.

It is to be appreciated that the structures resulting from the above exemplary processing schemes, e.g., structures from one or more of FIGS. 1A-1R, may be used in a same or similar form for subsequent processing operations to complete device fabrication, such as PMOS and NMOS device fabrication. As an example of a completed device, FIGS. 2A and 2B illustrate a cross-sectional view and a plan view (taken along the a-a' axis of the cross-sectional view), respectively, of a non-planar integrated circuit structure, in accordance with an embodiment of the present disclosure.

Figure 2A:
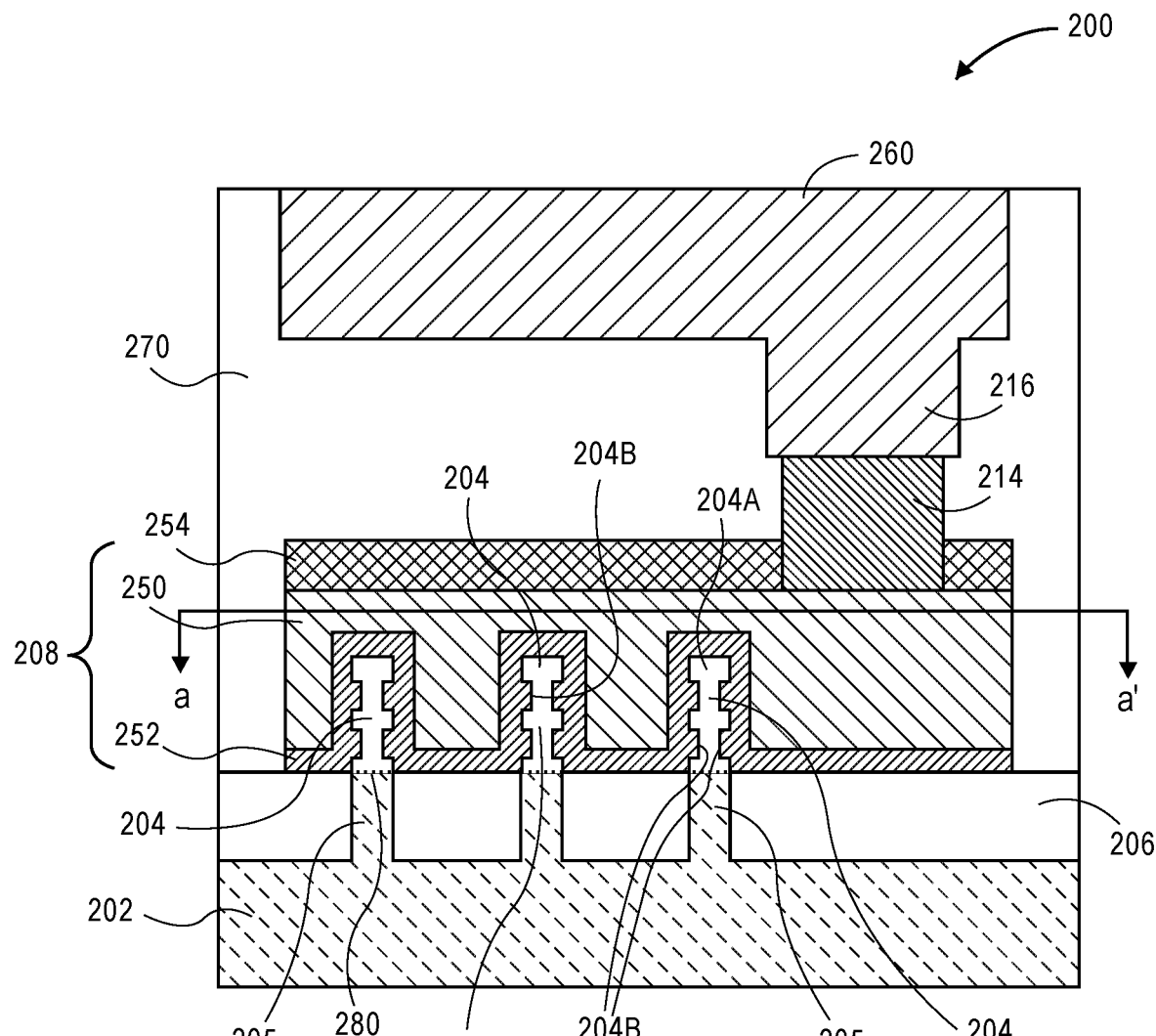
FIG. 2A illustrates a cross-sectional view of a non-planar integrated circuit structure, in accordance with an embodiment of the present disclosure.
Figure 2B:
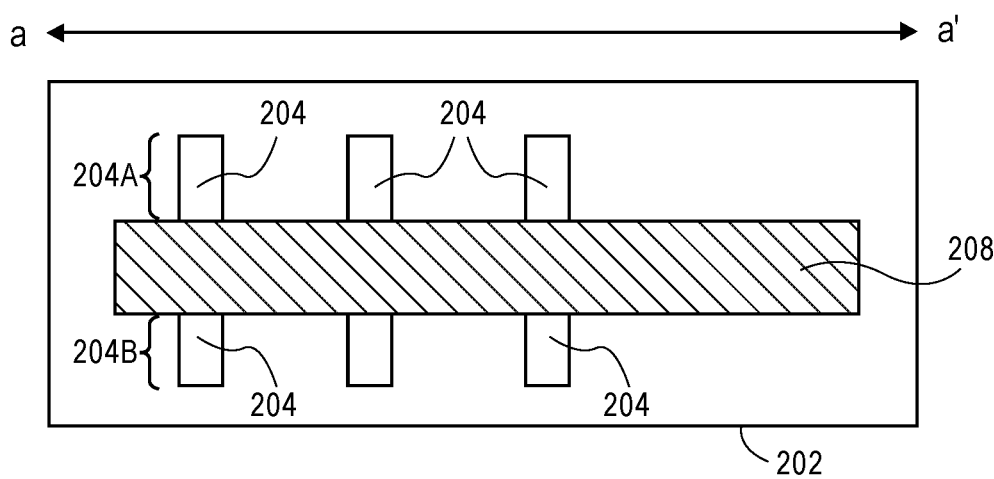
FIG. 2B illustrates a plan view taken along the a-a' axis of the non-planar integrated circuit structure of FIG. 2A, in accordance with an embodiment of the present disclosure.

Referring to FIGS. 2A and 2B, a semiconductor structure or device 200 includes a non-planar active region (e.g., a fin structure including protruding fin portion 204 and sub-fin region 205) formed on substrate 302, and within isolation region 206. In accordance with one or more embodiments described herein, each protruding fin portion 204 has a vertical portion 204A and one or more lateral recess pairs 204B in the vertical portion 204A. A plurality of such fins may be referred to as a grating structure of semiconductor fins. A gate line 208 is over the protruding portions 204 of the non-planar active region as well as over a portion of the isolation region 206.

As shown, gate line 208 includes a gate electrode 250 and a gate dielectric layer 252. In one embodiment, gate line 208 may also include a dielectric cap layer 254. A gate contact 214, and overlying gate contact via 216 are also seen from this perspective, along with an overlying metal interconnect 260, all of which are in inter-layer dielectric stacks or layers 270, such as low-k dielectric materials. Also seen from the perspective of FIG. 2A, the gate contact 214 is, in one embodiment, over isolation region 206, but not over the non-planar active regions. Alternatively, in another embodiment, the gate contact 214 is over one or more of the non-planar active regions to provide a contact over active gate layout.

As is also depicted in FIG. 2A, in an embodiment, an interface 280 exists between a protruding fin portion 204 and sub-fin region 205. The interface 280 can be a transition region between a doped sub-fin region 205 and a lightly or undoped upper fin portion 204. In one such embodiment, each fin is approximately 10 nanometers wide or less, and sub-fin dopants are supplied from an adjacent solid state doping layer at the sub-fin location. It is to be appreciated that the lightly or undoped upper fin portion 304 is characterized as such with respect to N-type or P-type dopants.

Referring to FIG. 2B, the gate line 208 is shown as over the protruding fin portions 204. Although not depicted, it is to be appreciated that a plurality of gate lines may be formed to provide a grating of gate lines. Source and drain regions 204A and 204B of the protruding fin portions 204 can be seen from this perspective. In one embodiment, the source and drain regions 204A and 204B are doped portions of original material of the protruding fin portions 204. In another embodiment, the material of the protruding fin portions 204 is removed and replaced with the same or a different semiconductor material as the protruding fin portions, e.g., by epitaxial deposition to form embedded source and drain regions. In either case, the source and drain regions 204A and 204B may extend below the height of dielectric layer 206, i.e., into the sub-fin region 205. In accordance with an embodiment of the present disclosure, the more heavily doped sub-fin regions, i.e., the doped portions of the fins below interface 280, inhibits source to drain leakage through this portion of the bulk semiconductor fins.

In an embodiment, the semiconductor structure or device 200 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 208 surround at least a top surface and a pair of sidewalls of the three-dimensional body.

Substrate 202 may be composed of a semiconductor material that can withstand a manufacturing process and in which charge can migrate. In an embodiment, substrate 202 is a bulk substrate composed of a crystalline silicon, silicon/germanium or germanium layer doped with a charge carrier, such as but not limited to phosphorus, arsenic, boron or a combination thereof, to form active region 204. In one embodiment, the concentration of silicon atoms in bulk substrate 202 is greater than 97%. In another embodiment, bulk substrate 202 is composed of an epitaxial layer grown atop a distinct crystalline substrate, e.g. a silicon epitaxial layer grown atop a boron-doped bulk silicon mono-crystalline substrate. Bulk substrate 202 may alternatively be composed of a group III-V material. In an embodiment, bulk substrate 202 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 202 is composed of a III-V material and the charge-carrier dopant impurity atoms are ones such as, but not limited to, carbon, silicon, germanium, oxygen, sulfur, selenium or tellurium.

In accordance with one or more embodiments of the present disclosure, the fin structure including protruding fin portion 204 and sub-fin region 205 has a same semiconductor composition as substrate 202. In a particular embodiment, the substrate 202 is a monocrystalline bulk silicon substrate, and the plurality of semiconductor fins 204/205 is a plurality of silicon fins. In accordance with one or more embodiments of the present disclosure, the fin structure including protruding fin portion 204 and sub-fin region 205 has a different semiconductor composition than substrate 202. In a particular embodiment, the substrate 202 is a monocrystalline bulk silicon substrate, and the plurality of semiconductor fins 204/205 is a plurality of silicon germanium or germanium fins. In another particular embodiment, the substrate 202 is a monocrystalline bulk silicon substrate, and the plurality of semiconductor fins 204/205 is a plurality of III-V material fins.

Isolation region 206 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 206 is composed of a dielectric material such as, but not limited to, silicon dioxide, silicon oxy-nitride, silicon nitride, or carbon-doped silicon nitride.

Gate line 208 may be composed of a gate electrode stack which includes a gate dielectric layer 252 and a gate electrode layer 250. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 202. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 200 involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 208 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of SF6. In another embodiment, dummy gates are composed of polycrystalline silicon or amorphous silicon and are removed with a wet etch process including use of aqueous NH4OH or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 200. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 2A, the arrangement of semiconductor structure or device 200 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO2)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 3:
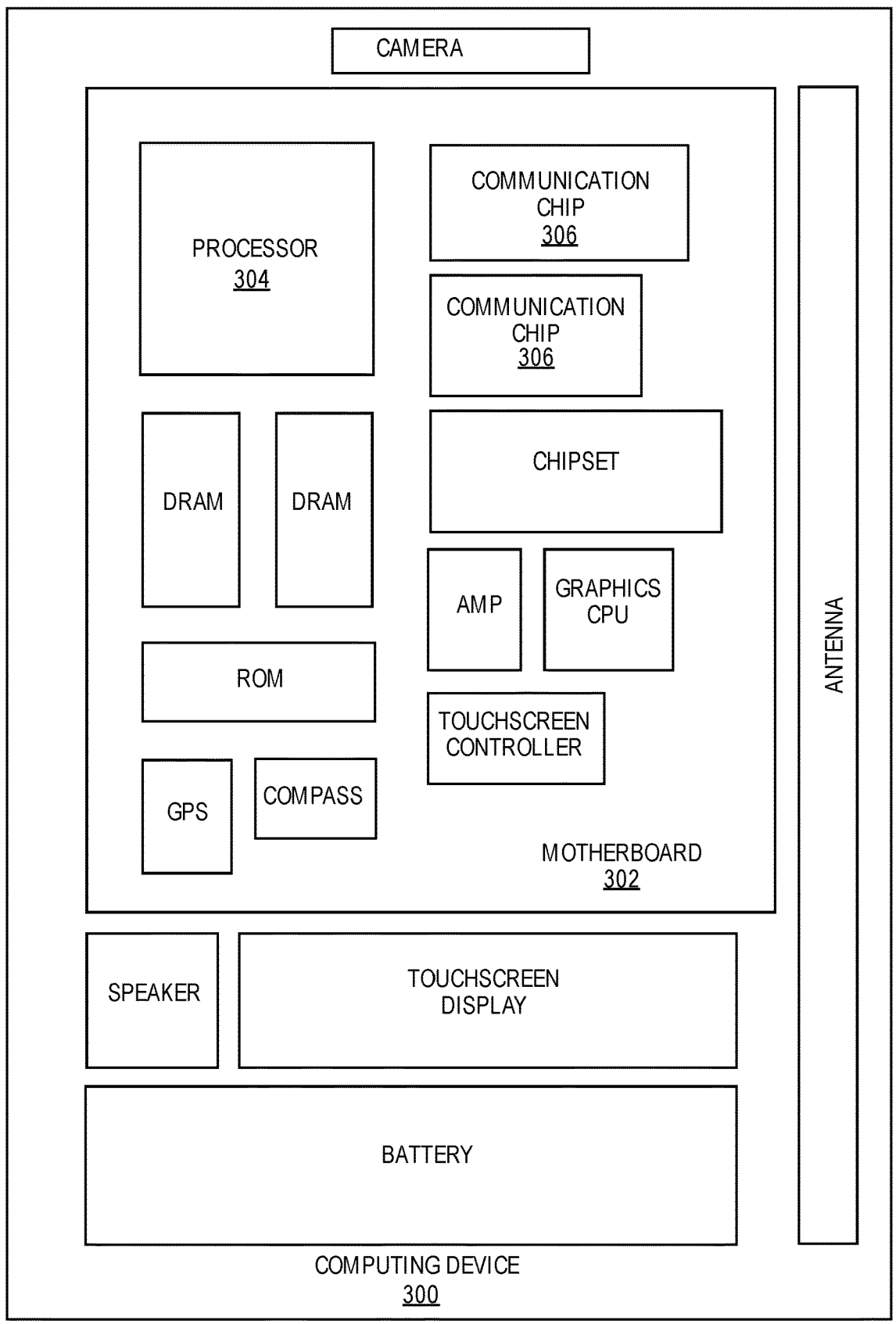
FIG. 3 illustrates a computing device in accordance with one implementation of an embodiment of the present disclosure.

FIG. 3 illustrates a computing device 300 in accordance with one implementation of an embodiment of the present disclosure. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of embodiments of the disclosure, the integrated circuit die of the processor includes one or more integrated circuit structures, such as semiconductor fins, built in accordance with double patterning implementations of embodiments of the disclosure. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the disclosure, the integrated circuit die of the communication chip includes one or more integrated circuit structures, such as semiconductor fins, built in accordance with double patterning implementations of embodiments of the disclosure.

In further implementations, another component housed within the computing device 300 may contain an integrated circuit die that includes one or more integrated circuit structures, such as semiconductor fins, built in accordance with double patterning implementations of embodiments of the disclosure.

In various embodiments, the computing device 300 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
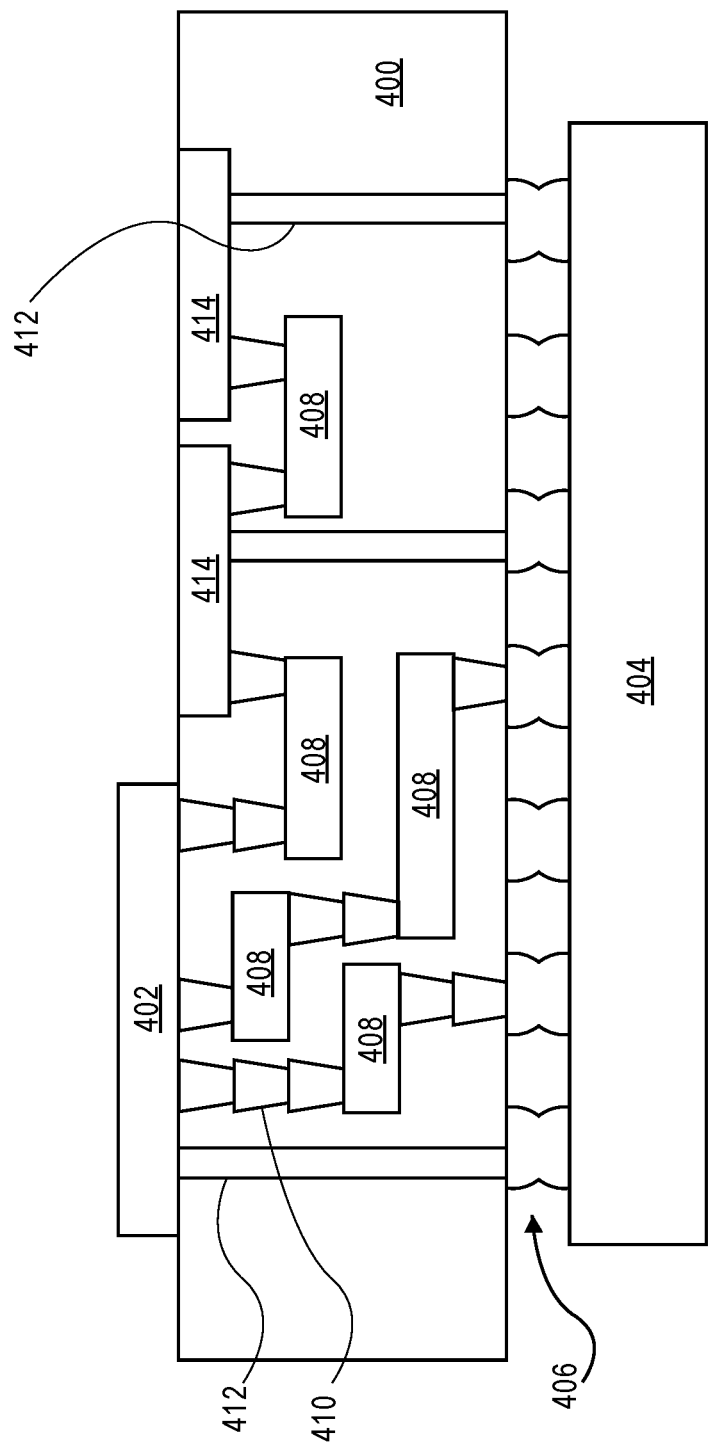
FIG. 4 illustrates an interposer that includes one or more embodiments of the present disclosure.

FIG. 4 illustrates an interposer 400 that includes one or more embodiments of the present disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

In an embodiment, the first substrate 402 is an integrated circuit die including one or more integrated circuit structures, such as semiconductor fins, built in accordance with double patterning implementations of embodiments of the disclosure. In an embodiment, the second substrate 404 is a memory module, a computer motherboard, or another integrated circuit die including one or more integrated circuit structures, such as semiconductor fins, built in accordance with double patterning implementations of embodiments of the disclosure.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the disclosure, apparatuses or processes disclosed herein may be used in the fabrication of interposer 400.

Thus, embodiments of the present disclosure include fin shaping using templates, and integrated circuit structures resulting therefrom.\

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a semiconductor fin having a protruding fin portion above an isolation structure above a substrate. The protruding fin portion has a vertical portion and one or more lateral recess pairs in the vertical portion. A gate stack is over and conformal with the protruding fin portion of the semiconductor fin. A first source or drain region is at a first side of the gate stack. A second source or drain region is at a second side of the gate stack opposite the first side of the gate stack.

Example Embodiment 2

The integrated circuit structure of example embodiment 1, wherein the semiconductor fin further includes a sub-fin portion on the substrate and laterally between an opening in the isolation structure, the sub-fin portion continuous with the protruding portion of the semiconductor fin.

Example Embodiment 3

The integrated circuit structure of example embodiment 1 or 2, wherein the substrate is a monocrystalline silicon substrate, and the semiconductor fin is a silicon fin.

Example Embodiment 4

The integrated circuit structure of example embodiment 1 or 2, wherein the substrate is a monocrystalline silicon substrate, and the semiconductor fin is a silicon germanium or germanium fin.

Example Embodiment 5

The integrated circuit structure of example embodiment 1 or 2, wherein the substrate is a monocrystalline silicon substrate, and the semiconductor fin is a III-V material fin.

Example Embodiment 6

The integrated circuit structure of example embodiment 1, 2, 3, 4 or 5, wherein the first and second source or drain regions are formed in regions of the semiconductor fin at the first and second sides of the gate stack, respectively.

Example Embodiment 7

The integrated circuit structure of example embodiment 1, 2, 3, 4 or 5, wherein the first and second source or drain regions are embedded source or drain regions.

Example Embodiment 8

The integrated circuit structure of example embodiment 1, 2, 3, 4, 5, 6 or 7, wherein the gate stack includes a gate dielectric including a high-k dielectric material, and a gate electrode including a metal.

Example Embodiment 9

An integrated circuit structure includes a plurality of semiconductor fins, individual ones of the plurality of semiconductor fins having a protruding fin portion above an isolation structure above a substrate, the protruding fin portion having a vertical portion and one or more lateral recess pairs in the vertical portion. Individual ones of the plurality of semiconductor fins also have a sub-fin portion on the substrate and laterally between an opening in the isolation structure, the sub-fin portion continuous with the protruding portion of the corresponding semiconductor fin.

Example Embodiment 10

The integrated circuit structure of example embodiment 9, further including a gate stack over and conformal with the protruding fin portion of each of the plurality of semiconductor fins, a first source or drain region at a first side of the gate stack, and a second source or drain region at a second side of the gate stack opposite the first side of the gate stack.

Example Embodiment 11

The integrated circuit structure of example embodiment 10, wherein the first and second source or drain regions are formed in regions of the plurality of semiconductor fin at the first and second sides of the gate stack, respectively.

Example Embodiment 12

The integrated circuit structure of example embodiment 10, wherein the first and second source or drain regions are embedded source or drain regions.

Example Embodiment 13

The integrated circuit structure of example embodiment 10, 11, or 12, wherein the gate stack includes a gate dielectric including a high-k dielectric material, and a gate electrode including a metal.

Example Embodiment 14

The integrated circuit structure of example embodiment 10, 11, 12 or 13, wherein the substrate is a monocrystalline silicon substrate, and the plurality of semiconductor fins is a plurality of silicon fins.

Example Embodiment 15

The integrated circuit structure of example embodiment 10, 11, 12 or 13, wherein the substrate is a monocrystalline silicon substrate, and the plurality of semiconductor fins is a plurality of silicon germanium or germanium fins.

Example Embodiment 16

The integrated circuit structure of example embodiment 10, 11, 12 or 13, wherein the substrate is a monocrystalline silicon substrate, and the plurality of semiconductor fins is a plurality of III-V material fins.

Example Embodiment 17

An integrated circuit structure includes a plurality of semiconductor fins, individual ones of the plurality of semiconductor fins having a protruding fin portion above an isolation structure above a substrate, the protruding fin portion having a vertical portion and one or more lateral recess pairs in the vertical portion. A dielectric wall substitutes one of the plurality of semiconductor fins.

Example Embodiment 18

The integrated circuit structure of example embodiment 17, wherein the individual ones of the plurality of semiconductor fins further includes a sub-fin portion on the substrate and laterally between an opening in the isolation structure, the sub-fin portion continuous with the protruding portion of the corresponding semiconductor fin.

Example Embodiment 19

The integrated circuit structure of example embodiment 17 or 18, wherein the substrate is a monocrystalline silicon substrate, and the plurality of semiconductor fins is a plurality of silicon fins.

Example Embodiment 20

The integrated circuit structure of example embodiment 17 or 18, wherein the substrate is a monocrystalline silicon substrate, and the plurality of semiconductor fins is a plurality of silicon germanium or germanium fins.

Example Embodiment 21

The integrated circuit structure of example embodiment 17 or 18, wherein the substrate is a monocrystalline silicon substrate, and the plurality of semiconductor fins is a plurality of III-V material fins.

Example Embodiment 22

The integrated circuit structure of example embodiment 17, 18, 19, 20 or 21, wherein the dielectric wall has a top surface above a top surface of the plurality of semiconductor fins.

What is claimed is:

1. An integrated circuit structure, comprising:
    a semiconductor fin having a protruding fin portion above an isolation structure, the protruding fin portion having a vertical portion and one or more lateral recess pairs in the vertical portion, and the vertical portion comprising a same semiconductor material continuous from a location above the one or more lateral recess pairs to a location below the one or more lateral recess pairs;
    a gate stack over and conformal with the protruding fin portion of the semiconductor fin;
    a first source or drain region at a first side of the gate stack; and
    a second source or drain region at a second side of the gate stack opposite the first side of the gate stack.

2. The integrated circuit structure of claim 1, wherein the semiconductor fin further comprises a sub-fin portion laterally between an opening in the isolation structure, the sub-fin portion continuous with the protruding portion of the semiconductor fin.

3. The integrated circuit structure of claim 2, wherein the semiconductor fin is a silicon fin.

4. The integrated circuit structure of claim 2, wherein the semiconductor fin is a silicon germanium or germanium fin.

5. The integrated circuit structure of claim 2, wherein the semiconductor fin is a III-V material fin.

6. The integrated circuit structure of claim 1, wherein the first and second source or drain regions are formed in regions of the semiconductor fin at the first and second sides of the gate stack, respectively.

7. The integrated circuit structure of claim 1, wherein the first and second source or drain regions are embedded source or drain regions.

8. The integrated circuit structure of claim 1, wherein the gate stack comprises a gate dielectric comprising a high-k dielectric material, and a gate electrode comprising a metal.

9. An integrated circuit structure, comprising:
    a plurality of semiconductor fins, individual ones of the plurality of semiconductor fins having a protruding fin portion above an isolation structure, the protruding fin portion having a vertical portion and one or more lateral recess pairs in the vertical portion, and the vertical portion comprising a same semiconductor material continuous from a location above the one or more lateral recess pairs to a location below the one or more lateral recess pairs, and individual ones of the plurality of semiconductor fins having a sub-fin portion laterally between an opening in the isolation structure, the sub-fin portion continuous with the protruding portion of the corresponding semiconductor fin.

10. The integrated circuit structure of claim 9, further comprising:
a gate stack over and conformal with the protruding fin portion of each of the plurality of semiconductor fins;
a first source or drain region at a first side of the gate stack; and
a second source or drain region at a second side of the gate stack opposite the first side of the gate stack.

11. The integrated circuit structure of claim 10, wherein the first and second source or drain regions are formed in regions of the plurality of semiconductor fin at the first and second sides of the gate stack, respectively.

12. The integrated circuit structure of claim 10, wherein the first and second source or drain regions are embedded source or drain regions.

13. The integrated circuit structure of claim 10, wherein the gate stack comprises a gate dielectric comprising a high-k dielectric material, and a gate electrode comprising a metal.

14. The integrated circuit structure of claim 9, wherein the plurality of semiconductor fins is a plurality of silicon fins.

15. The integrated circuit structure of claim 9, wherein the plurality of semiconductor fins is a plurality of silicon germanium or germanium fins.

16. The integrated circuit structure of claim 9, wherein the plurality of semiconductor fins is a plurality of III-V material fins.

17. An integrated circuit structure, comprising:
a plurality of semiconductor fins, individual ones of the plurality of semiconductor fins having a protruding fin portion above an isolation structure, the protruding fin portion having a vertical portion and one or more lateral recess pairs in the vertical portion, and the vertical portion comprising a same semiconductor material continuous from a location above the one or more lateral recess pairs to a location below the one or more lateral recess pairs; and
a dielectric wall substituting one of the plurality of semiconductor fins.

18. The integrated circuit structure of claim 17, wherein the individual ones of the plurality of semiconductor fins further comprise a sub-fin portion laterally between an opening in the isolation structure, the sub-fin portion continuous with the protruding portion of the corresponding semiconductor fin.

19. The integrated circuit structure of claim 18, the plurality of semiconductor fins is a plurality of silicon fins.

20. The integrated circuit structure of claim 18, wherein the plurality of semiconductor fins is a plurality of silicon germanium or germanium fins.

21. The integrated circuit structure of claim 18, the plurality of semiconductor fins is a plurality of III-V material fins.

22. The integrated circuit structure of claim 17, wherein the dielectric wall has a top surface above a top surface of the plurality of semiconductor fins.

* * * * *